United States Patent
Bidal et al.

(10) Patent No.: US 8,288,754 B2
(45) Date of Patent: Oct. 16, 2012

(54) QUANTUM-DOT DEVICE AND POSITION-CONTROLLED QUANTUM-DOT-FABRICATION METHOD

(75) Inventors: Gregory Bidal, Eindhoven (NL); Frederic Boeuf, Eindhoven (NL); Nicolas Loubet, Eindhoven (NL)

(73) Assignees: NXP B.V., Eindhoven (NL); ST MicroElectronics (Crolles 2) SAS, Crolles (FR)

( * ) Notice: Subject to any disclaimer, the term of this patent is extended or adjusted under 35 U.S.C. 154(b) by 54 days.

(21) Appl. No.: 12/920,796

(22) PCT Filed: Mar. 11, 2009

(86) PCT No.: PCT/EP2009/052840
§ 371 (c)(1), (2), (4) Date: Sep. 2, 2010

(87) PCT Pub. No.: WO2009/112510
PCT Pub. Date: Sep. 17, 2009

(65) Prior Publication Data
US 2011/0006280 A1    Jan. 13, 2011

(30) Foreign Application Priority Data
Mar. 11, 2008 (EP) .................................... 08290229

(51) Int. Cl.
*H01L 29/66* (2006.01)
*H01L 21/20* (2006.01)

(52) U.S. Cl. ............... 257/9; 257/E29.168; 257/E21.09; 438/492; 977/937

(58) Field of Classification Search ......... 257/9, E21.09, 257/E21.218, E21.209, E29.168; 438/257, 438/29, 492, 585, 591; 977/937
See application file for complete search history.

(56) References Cited

U.S. PATENT DOCUMENTS
2005/0142721 A1    6/2005    Koh
2005/0142753 A1    6/2005    Koh
(Continued)

FOREIGN PATENT DOCUMENTS
WO    2006/031257 A2    3/2006

OTHER PUBLICATIONS
J.L. Liu, Y. Shi, F. Wang, Y. Lu, R. Zhang, P. Han, S.L. Gu, and Y.D. Zheng; A Method of fabricating silicon quantum wires based on SiGe/Si heterostructure; Applied Physics Letters, vol. 68, No. 3; Jan. 15, 1996; p. 352-354.
(Continued)

*Primary Examiner* — Benjamin Sandvik
*Assistant Examiner* — Whitney T Moore

(57) ABSTRACT

The present invention relates to a method for position-controlled fabrication of a semiconductor quantum dot, the method comprising: providing a substrate (102) of a substrate material; depositing a sacrificial layer (108) of a sacrificial material; depositing an active layer (110) of a semiconductive active material on the sacrificial layer, wherein the substrate, sacrificial and active materials are chosen such that the sacrificial layer is selectively removable with respect to the substrate and the active layer, depositing and patterning a mask layer on the active layer so as to define desired quantum-dot positions in lateral directions, fabricating a lateral access to the sacrificial layer in regions underneath the patterned mask layer; selectively removing, with respect to the substrate and the active layer, the sacrificial layer from underneath the active layer at least under the patterned mask layer; and etching the active layer under the patterned mask layer from underneath the active layer so as to assume a desired quantum-dot shape.

12 Claims, 4 Drawing Sheets

U.S. PATENT DOCUMENTS

2005/0233487 A1    10/2005   Liu et al.
2006/0086970 A1*    4/2006   Kim .............................. 257/321

OTHER PUBLICATIONS

Y. Shi, J.L. Liu, F. Wang, Y. Lu, R. Zhang, S.L. Gu, P. Han, L.Q. Hu, and Y.D. Zheng; Ultrafine silicon quantum wires fabricated by selective chemical etching and thermal oxidation; JVST A-Vacuum Surface and Films, vol. 14, No. 3; May 1, 1996; p. 1194-1198.
International Search Report; PCT/EP2009/052840, May 25, 2009.
Written Opinion of the International Searching Authority; PCT/EP2009/052840, May 25, 2009.

* cited by examiner

QUANTUM-DOT DEVICE AND POSITION-CONTROLLED QUANTUM-DOT-FABRICATION METHOD

FIELD OF THE INVENTION

The present invention relates to a method for position-controlled fabrication of a semiconductor quantum dot, and to a method for fabricating a semiconductor quantum-dot device. The invention also relates to a semiconductor quantum-dot device.

BACKGROUND OF THE INVENTION

Semiconductor quantum dots, which are in short also referred to as dots in this specification, comprise a semiconductor structure with extensions in all three dimensions of space, which restrict the mobility of one or more charge carriers in the semiconductor material of the quantum dot to an extent, that the one or more charge carriers assume quantized states with respect to all three dimensions of space. As is well known, charge carriers in semiconductors, i.e., electrons and holes, can be described by complementary physical models as having particle properties or wave properties. From a quantum-mechanical point of view, the wave functions of the one or more charge carriers within the quantum dot are restricted in their extension in space to a value, which is smaller than the De-Broglie wavelength of the charge carriers. The De-Broglie wavelength is defined as the ratio of Planck's constant h and the momentum p of the particle.

The restriction of the mobility (in the particle aspect) or wave function (in the wave aspect) of the charge carriers is achieved by embedding the semiconductor quantum dot into a barrier. The barrier is a material with an energy gap between the valance band and the conduction band, which energy gap is larger than that of the semiconductor material of the quantum dot. The energy gap is in the art called the band gap. In other words, the barrier can be a semiconductor with a larger band gap than the semiconductor of the quantum dot, or it can be an insulator.

Semiconductor quantum dots have advantageous electronic and optical properties. For instance, optoelectronic applications like light-emitting diodes or laser diodes can profit from an increased efficiency of radiative recombination of electrons and holes in a quantum dot. This can be achieved by tailoring the size, the shape and the material of the quantum dot so as to increase the overlap of the wave functions of electrons and holes within the quantum dot. An increased wave-function overlap raises the probability of radiative recombination. It also increases the probability of light absorption by the quantum dot in comparison with bulk material, which is an advantage for detector applications. Another application of quantum dots is their use as single-photon emitters, for instance in cryptographical applications.

The quantum dots can be designed by proper choice of material composition, geometrical shape and size to emit or absorb light in a desired spectral range.

However, quantum dots are also interesting for purely electronic applications, including memories or transistors. By proper design, quantum dots can be configured to store a charge for a very long time. That is, an electron-hole pair representing an information bit can be generated in certain types of quantum dots, wherein the wave-functions of the electron and the hole have a very poor overlap, thus deliberately keeping the probability of recombination low for the purpose of storing the information bit.

Semiconductor quantum-dot devices have attracted considerable interest in research and development since the early 1990s when self-organized quantum-dot formation on a substrate in the Volmer-Weber and, in particular, Stranski-Krastanov growth modes was employed as a reliable hetero-epitaxial technique for fabricating quantum dots of rather homogeneous shape and size. However, a self-organized growth on nanostructures has the disadvantage that it is difficult to control the growth of a semiconductor quantum dot at an exact desired lateral position on a substrate.

In many applications, however, it is in fact desired to control the exact lateral position of the quantum dots on a substrate. One method for fabricating quantum dots with position control is disclosed in US 2005/0233487 A1. A disadvantage of this method is that it requires a multiple patterning steps of a complex layer structure with lithographic techniques. In addition, the patterning must be applied in two lateral directions.

It would be desirable to provide a simpler process for position-controlled fabrication of a semiconductor quantum dot. It would also be desirable to provide a semiconductor quantum-dot device structure, in which the semiconductor quantum dots can be fabricated in a position-controlled process at low complexity and cost.

SUMMARY OF THE INVENTION

According to a first aspect of the invention, a method for position-controlled fabrication of a semiconductor quantum dot is provided. The method comprises:
  providing a substrate of a substrate material and having a front substrate surface, an opposite back substrate surface, and an inner substrate region extending from the front substrate surface to the back substrate surface;
  depositing a sacrificial layer of a sacrificial material on the front substrate surface;
  depositing an active layer of a semiconductive active material on the sacrificial layer, wherein the substrate, sacrificial and active materials are chosen such that the sacrificial layer is selectively removable with respect to the substrate and the active layer,
  depositing and patterning a mask layer on the active layer so as to define desired quantum-dot positions with respect to lateral directions,
  fabricating a lateral access to the sacrificial layer in regions underneath the patterned mask layer;
  selectively removing, with respect to the substrate and the active layer, the sacrificial layer at least from underneath the patterned mask layer; and
  etching the active layer under the patterned mask layer from underneath the active layer so as form the quantum dot with a convex second surface section, which is oriented towards the inner substrate.

The method of the first aspect of the invention has the advantage of providing a simple way to control the position of a quantum dot with a convex surface section. The convex surface section is also referred to as the second surface section of the quantum dot to comply with the definition of a quantum-dot device of the second aspect of the invention.

The invention recognizes that the exact lateral position of semiconductor quantum dots with a convex surface section can be controlled with low process-complexity when turning away from the general concept applied in the art that the orientation of the geometrical shape of convex quantum dots must be upright. In other words, in prior-art dot devices, the convex surface section of the dot comprises the last-deposited atomic or molecular layers of the active layer, while the first surface section comprises the first-deposited atomic or molecular layers of the active layer. The opposite is the case in the structure and the processing of the quantum dots in the device of the invention. Here, the convex surface section of the dot comprises the first-deposited atomic or molecular layers of the active layer, while the first surface section comprises the last-deposited atomic or molecular layers of the active layer.

In the Stranski-Krastanov or Volmer-Weber growth modes used in the prior art to fabricate dots with convex surface sections, the upright orientation is forced by the direction of self-organized dot-shaped growth of the active layer perpendicular to the substrate.

However, the present invention has the advantage to make use of these well-understood geometrical dot structures. For the orientation of the dots does not influence their electronic structure. The electronic structure determines the energy difference between a ground state and excited states of charge carriers or agglomerates of charge carriers like excitons (an electron and a hole bound to each other) in the dot. It is responsible for the electronic and the optical characteristics of the quantum-dot device. The detailed dot design, that is, the specific geometrical parameters of the dots, can therefore easily be determined in the layout process prior to fabrication on the basis of existing models for prior-art "upright" dot designs. Using the already existing computational modeling techniques in this field further reduces the overall fabrication cost and allows a high reliability in tailoring the geometrical dot structure to the needs of specific application case.

Other techniques like that of US 2005/0233487 A1 generate a cylindrical dot shape from a pre-deposited layer stack by a lithographic process. A cylindrical dot shape is geometrically indifferent with respect to an upright or an inverted orientation. As such, the cylindrical dot shape cannot suggest an inverted dot shape for achieving a simple fabrication process. In fact, as was discussed before, the processing suggested in US 2005/0233487 A1 is complex. There is no indication towards the modified processing according to the invention.

Convex dot-surface sections are as such known from quantum dots fabricated in the Stranski-Krastanov growth mode. However, as explained, while such known quantum-dot structures have a convex surface pointing away from the inner substrate region of the substrate, on which they are grown, the convex second dot-surface section of the quantum dots of the present invention does point towards the inner substrate region. The quantum dots generated by the process of the present invention, therefore, have a convex shape with an inverted orientation in comparison with dots fabricated by the mentioned techniques.

This shape allows generating the dots with high lateral position control by an etching of the active layer under the patterned mask layer from underneath the active layer. This processing is less complex in comparison to the method of US 2005/0233487 A1, and allows fabricating dots with exact lateral position control at comparatively low cost.

Note that, for the purpose of proper definition, the term "inner substrate region" or "inner substrate" is used with reference to the substrate at the time of fabrication of the quantum dots, and, more specifically, during the time span between providing the substrate, on which the quantum dots are fabricated, and the finishing of the dot fabrication. Additional layers may be deposited after the fabrication of the quantum dots, for instance wave-guide layers in optoelectronic applications. Such additional layers may place the quantum dots in the middle of a layer structure of a wafer after finishing the complete device fabrication process. Reference to such a structure when interpreting the term "inner substrate" would cause unclarity or a misunderstanding of the meaning of the term. The skilled person, when looking at a cross-sectional view of a wafer after the processing has been finished, knows to distinguish, which layers of such a finished processed wafer were present at the time when dot fabrication started, and is instructed by the definition of the present invention to interpret the term "inner substrate" with reference to this processing stage.

Further concerning a proper interpretation of terms used herein, note that some terms used to describe the shape of a quantum dot are "borrowed" from the macroscopic world, but necessarily have a modified meaning on a nanometer scale, which is relevant in the present context. The term convex, when applied to a surface section of a macroscopic physical body, generally means that the surface section is curved towards the outside of the body. In other words, a convex surface is bulging outwards. Quantum dots, however, have sub-micrometer extensions and cannot be considered macroscopic. In the regime of nanoparticles such as quantum dots, therefore, a convex surface section is to be considered a surface that has a two or more facets that together result in an approximately curved shape. Thus, the term convex is to be understood with a meaning that includes any embodiment, in which the second surface section bulges outwards from the quantum dot. It includes the particular embodiments of a second-surface section, which in the first cross-sectional view of the second dot-surface section is triangular (such as the cross-section of a dot in the shape of a pyramid or tetrahedron) or trapezoidal (the cross-section of a dot in a shape resembling a truncated cone).

In some embodiments, the process of the invention can make use of techniques known from the so-called "Silicon-On-Nothing" (SON) process. This is mentioned without limitation. Silicon is an important material for many interesting application cases but not the only possible material of the active layer. The SON process can be applied to other material combinations in analogy, with adaptations made as desired in materials and suitable etching recipes and process parameters.

In the following, embodiments of the method of the first aspect of the invention will be described. The additional features of the respective embodiments can be combined with each other, unless they are explicitly described as forming alternatives to each other.

Preferably, the mask layer laterally is patterned to extend onto a dielectric layer, in order to make defining the position of the dots at the first stage of the fabrication process easier. The dielectric layer is suitably an isolation region used anyway in the fabrication process, such as a shallow-trench isolation (STI) region. One embodiment therefore comprises fabricating an isolation region extending into the active semiconductor layer, and suitably through the sacrificial layer, before depositing and patterning the mask layer. The patterning is the preferably performed so as to let the mask layer partly extend on the active semiconductor layer, and partly on the isolation region.

In one embodiment, a barrier layer is fabricated on the active layer before depositing the mask layer. The barrier layer is made of a material, which has a larger band gap than the active layer. In one embodiment, where the active layer is made of Silicon, the barrier layer is for instance made of Silicon dioxide. However, other materials can be used as well, including those of a barrier formed underneath the quantum dot in some embodiments during later processing steps.

The etching of the active layer to assume a desired quantum-dot shape preferably comprises applying a vapor-phase etch process for a suitable time span to the active layer under the patterned mask layer after removing the sacrificial layer. Suitable etching agents are for instance based on HCl.

The barrier can in principle be any material with a larger band gap than the active layer. In principle the barrier can also be formed by an isolating gaseous atmosphere underneath the quantum dot, including air. However, for improving the confinement, some embodiments further comprise:

refilling the space formerly assumed by the removed sacrificial layer regions with a semiconductive or insulating barrier that has an energy band gap between a valence band and a conduction band and that has a thickness, which both are suitable for forming a barrier to the motion of the one or more charge carriers in the semiconductor quantum dot.

Suitable barrier materials for the case of a silicon active layer are materials with a larger band gap than silicon, including silicon-carbon alloys, or insulating material such as silicon dioxide, silicon nitride or silicon oxynitride. In one embodiment, a stack of silicon dioxide, silicon nitride and silicon oxide is used, which in the art is also referred to as an ONO stack.

The device fabrication can further include the fabrication of a gate stack. Preferably, but not necessarily, the gate stack is fabricated in place of the mask layer, for instance after the refilling step according to the previously described embodiment. The gate isolation layer, which forms a part of the gate stack, can be an earlier-deposited isolation layer underneath the mask layer. This has the advantage of protecting the quantum dots in process of removing the mask layer. This avoids the formation of defects in the first surface section of the quantum dots, which would be otherwise be exposed to the processing agents during the removal of the mask layer and the fabrication of the gate stack. However, where the defect formation can be avoided by corresponding precautions, it is also possible to perform the removal of the mask layer and subsequent fabrication of the gate stack without an earlier deposited isolation layer.

For electronic applications, the substrate is preferably provided with active regions, which are laterally defined by isolation regions. The quantum dots are then fabricated in the active regions. To this end, the mask layers can be deposited as hardmasks on the substrate and then patterned to extend on either the active region alone or on both the active region and the isolation region. In some embodiments, stripe-shaped masks are used, which partly extend on the isolation region and partly extend into the active region to define the desired lateral position of the quantum dot.

Preferably, the materials of the substrate and of the active layer are silicon, whereas the material of the sacrificial layer is silicon-germanium. Etching processes for selective removal of silicon-germanium are well known. However, other combinations of suitable semiconductor materials, which can be etched with a corresponding selectivity can be used as well. The material choice of course also depends on the desired application. For instance, for optoelectronic applications, the spectral range, in which the quantum-dot device is intended to operate, will be another selection criterion for suitable materials. The method of the present invention is thus advantageously applied in the fabrication of semiconductor quantum-dot devices for electronic or optoelectronic applications.

According to the second, i.e., the device aspect of the present invention, a semiconductor quantum-dot device is provided, comprising:

a substrate having a front substrate surface, an opposite back substrate surface, and an inner substrate region extending from the front substrate surface to the back substrate surface;

at least one semiconductor quantum dot embedded in a barrier and being arranged at a smaller distance from the front substrate surface than from the back substrate surface, the barrier and the quantum dot being made of respective materials and with geometrical extensions, which materials and extensions are suitable for spatially confining the mobility of one or more charge carriers in the quantum dot to an extent that the one or more charge carriers assume quantized states with respect to all three dimensions of space;

wherein the quantum dot, as seen in a cross-sectional view revealing a first cross-sectional plane, has first and second mutually opposite lateral end points, which form lateral end points of a first dot-surface section interfacing with the barrier, which first dot-surface section is at least approximately parallel to the front substrate surface, and which also form lateral end points of a convex second dot-surface section interfacing with the barrier, wherein the second surface section of the quantum dot is oriented towards the inner substrate.

The device aspect of the present invention is correlated with the method aspect. The structure of the dots according to the device aspect of the invention allows using the fabrication process according to the method aspect of the invention, requiring less complexity and cost. On the other hand, the obtained structure of the quantum dots results from the processing concept of the method of the invention. The etching of the active layer under the patterned mask layer from underneath the active layer provides is performed so as to let the second surface section of the quantum dot assume a desired convex shape.

The quantum-dot device of the present invention shares the advantages of the method of the first aspect of the invention. It provides exactly positioned quantum dots with a low processing cost.

In the following, embodiments of the semiconductor quantum-dot device will be described. The additional features of the embodiments can be combined with each other, unless they are disclosed as forming alternatives to each other.

As mentioned before, the convex second dot-surface section can assume different specific shapes in various embodiments. Typically, the second dot-surface section will comprise facets, which are inclined to the first surface section. The number of facets, which constitute the convex shape of the second dot-surface section, varies in different embodiments. In a trapezoidal shape, there are three facets. The higher the number of facets is, the closer is the resemblance to a round convex surface.

The dot shape, as seen in a plan view, may be designed symmetrical in some embodiments or not symmetrical in other embodiments. In one embodiment, the first surface section, as seen in a plan view, is approximately a square. However, a rectangle, in which the sides of the first surface section have different length values, is also possible. The geometrical shape can be adjusted depending on the desired electronic structure of the quantum dots. The second surface section may also be convex in another cross-sectional view (referred to as A-A' further below) that reveals a second cross-sectional plane, which is perpendicular to the first cross-sectional plane referred to in the definition of the semiconductor quantum-dot device of the present invention (and referred to as V-V further below). In this embodiment, there are third and fourth mutually opposite end points, which form lateral end points of the first dot-surface section as well as of the convex second dot-surface section.

The semiconductor quantum-dot device of the invention, or any one of its embodiments described herein, can be provided in an electronic component in integrated form on a single chip together with other circuitry, or as one chip of a chip assembly, or as a standalone electronic component.

Preferred embodiments of the invention are also defined in the dependent claims.

BRIEF DESCRIPTION OF THE DRAWINGS

The invention will now be explained in more detail with reference to the drawings in which.

DETAILED DESCRIPTION OF EMBODIMENTS

FIGS. 1 to 4 are perspective sectional views of a semiconductor quantum-dot device according to an embodiment of the present invention in different stages of its fabrication. The fabrication of semiconductor quantum dots for a semiconductor quantum-dot device 100 starts with providing a substrate 102.

The substrate material of the substrate 100 is in the present embodiment Silicon. Silicon is an advantageous substrate material because it is available in the form of wafers with large diameter for industry-scale fabrication processes. Since Silicon is widely used in the semiconductor industry, the use of a silicon substrate also provides compatibility with existing processing technologies for semiconductor devices and allows integrating the semiconductor quantum-dot device of the present embodiment with other semiconductor devices such as transistors, diodes and integrated circuits on a single chip.

Figure 1:
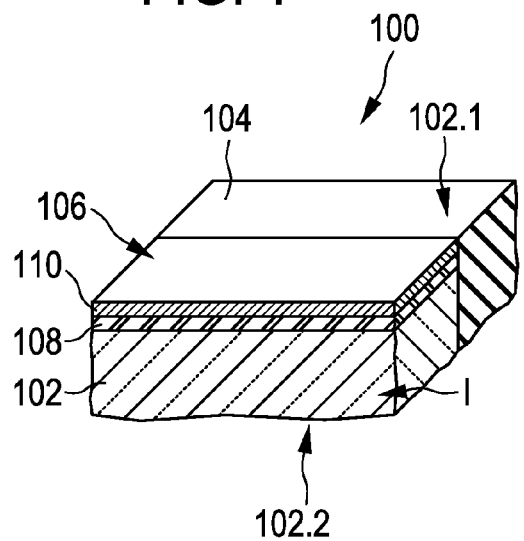
FIGS. 1 to 4 are perspective sectional views of a semiconductor quantum-dot device according to an embodiment of the present invention in different stages of its fabrication.
Figure 2:
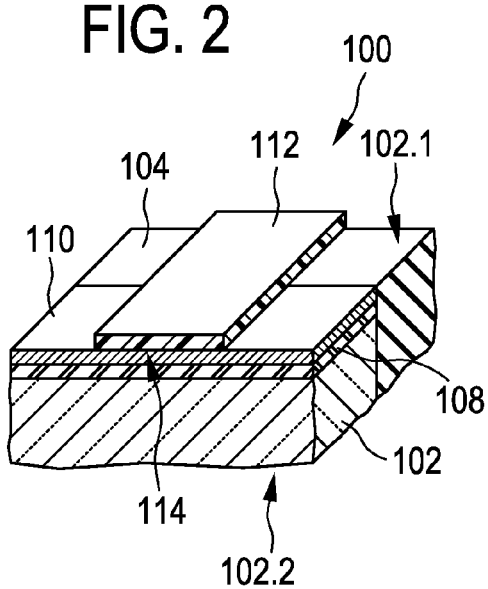

Note that only a section of the substrate 102 is shown in FIG. 1 and in the following Figures. The section is selected to illustrate the process used for the fabrication of semiconductor quantum dots. The Silicon substrate 102 is processed according to standard methods to provide insulation regions 104, which laterally define active regions 106. In the active regions, the semiconductor quantum dots are fabricated, along with other semiconductor components, according to the needs of a particular application. The isolation regions are typically fabricated as shallow-trench isolations, as is well known from standard MOS and CMOS processing.

In the processing stage shown in FIG. 1, the substrate 102 is already covered by a sacrificial layer 108 and by an active (and semiconductive) layer 110. The sacrificial and active layers 108 and 110 are preferably deposited before the fabrication of the isolation regions 104 for achieving an easier processing, but in an alternative embodiment these layers are deposited after the fabrication of the isolation regions. The isolation regions laterally define active regions of the active semiconductor layer.

The material of the sacrificial layer 108, herein also referred to as the sacrificial material, is selected such that the sacrificial layer is selectively removable with respect to the substrate 102 and the active layer 110. For the case of a Silicon substrate and a Silicon active layer, the sacrificial material is suitably Silicon-Germanium. The process of removing Silicon-Germanium selectively with respect to surrounding Silicon layers is well controllable and as such known in the art. The skilled person is also aware of the Germanium content in the sacrificial layer that is necessary to obtain the required selectivity. The material of the active layer is Silicon in the present embodiment. However, the material can be selected according to the desired application. For instance, optoelectronic devices are fabricated for operation in different spectral ranges. The active material, i.e., the material of the active layer 110, should therefore be selected accordingly. Silicon is a material, which can be used in optoelectronic applications in the near infrared spectral range and in the visible spectral range, depending on the desired application. The spectral fine tunings also takes into account the blue shift of the spectral characteristics, which is typical for nanoscale semiconductor devices like quantum wells, quantum wires and quantum dots.

Subsequently, a mask layer, herein also referred to as a hardmask layer 112 is deposited on the wafer and patterned to provide hardmasks 112 at desired lateral positions for the fabrication of semiconductor quantum dots. The patterning is performed so as to let the hardmask layer partly extend on the active semiconductor layer, and partly on the isolation region. This allows defining the position of the dots with respect to lateral directions.

Figure 3:
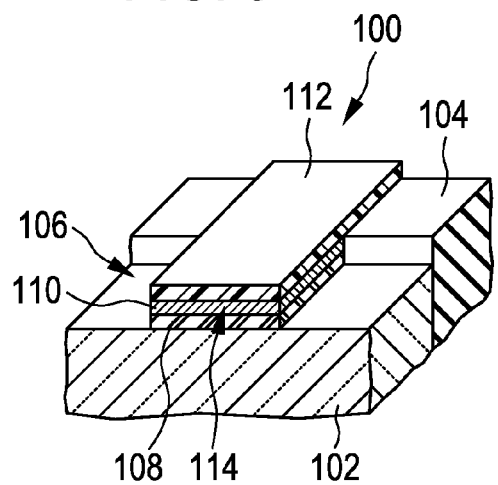

In a next step, the result of which is shown in FIG. 3, the layer stack of the sacrificial layer 108 and the active layer 110 is removed from those parts of the active regions 106, which are not covered by the hardmask 112. The isolation regions 104 remain unaffected by this step.

Figure 4:
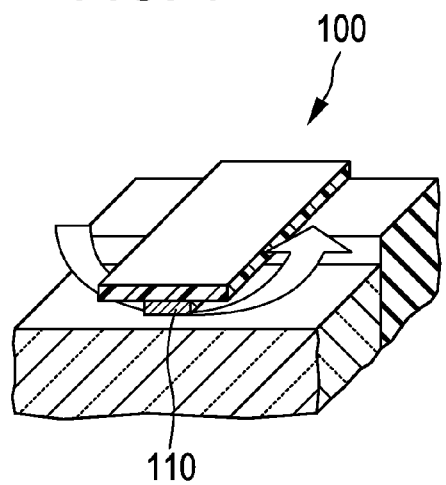

In a subsequent step, which is schematically illustrated in FIG. 4, the sacrificial layer 108 is selectively removed from underneath the active layer under the hardmask 112. In this step, the active layer may be partly removed such that is lateral extension under the hardmask is reduced. Depending on the controllability of the process, this patterning of the active layer 110 can be performed in the same etching step as the removal of the sacrificial layer 108. However, if the selectivity of the etching process 108 is very high, the patterning of the active layer 110 can be performed separately after the selective etching of the sacrificial SiGe layer 108.

Subsequently, the patterning of the active layer 110 is continued to fabricate quantum dots of a desired shape and extension in lateral directions.

Figure 5:
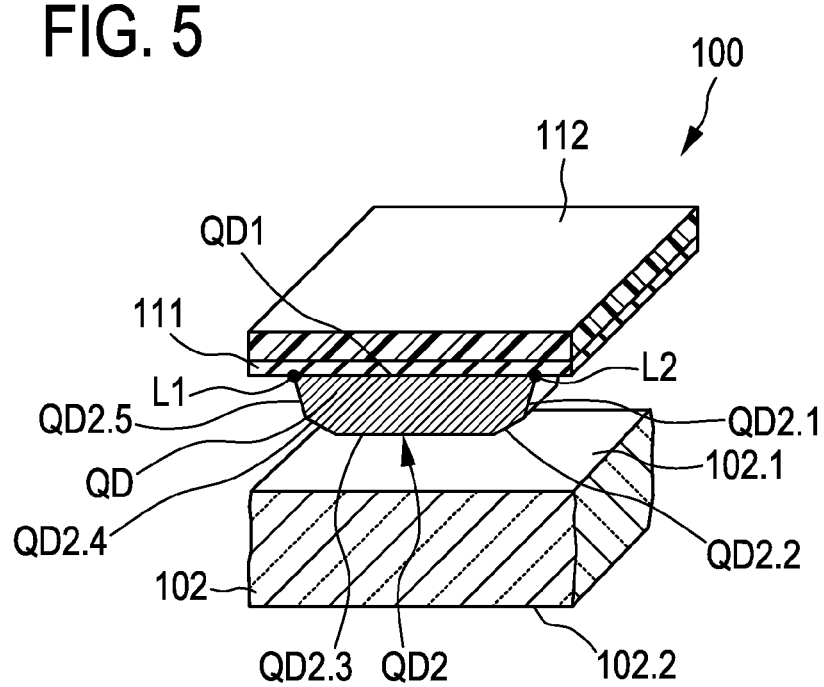
FIG. 5 is a schematic cross-sectional view of the semiconductor quantum-dot device of the same embodiment at a subsequent processing stage.

FIG. 5 shows a schematic cross-sectional view of the semiconductor quantum-dot device after the trimming and shaping of the semiconductor quantum dot 110. As can be seen in the cross-sectional view of FIG. 5, the semiconductor quantum QD110 formed from the active layer 110 has lateral end points L1 and L2. These lateral end points form lateral end points of a first dot-surface QD1, which interfaces with the insulating barrier layer 111. As such, the first dot-surface QD1 is essentially flat and parallel to the substrate surface 102.1. At the same time, the lateral end points L1 and L2 form lateral end points of a convex second dot-surface QD2. The convex second dot-surface is composed of crystal facets of the quantum dot QD, which are shown under reference labels QD2.1 to QD2.5. Note that this is a purely schematic representation. There is no limitation as to the number of facets other than that there are at least two crystal facets visible in a cross-sectional view. As can be seen, the quantum dot QD is oriented such that the convex second dot-surface section QD2 is oriented towards the inner substrate I, which is the substrate region between the front substrate surface 102.1 and the back substrate surface 102.2.

To obtain the desired convex shape of the second dot-surface section QD2, a suitable vapor-phase etching process is employed. A suitable etching agent is HCl. The etching process performed for a suitable time duration, so as to obtain the desired lateral extensions of the quantum dot QD and the desired extension in the depth direction. It is a matter of experimental adjustment of the process parameters in a particular production equipment to define the exact respective process parameters required for obtaining specific dot shapes.

Figure 6:
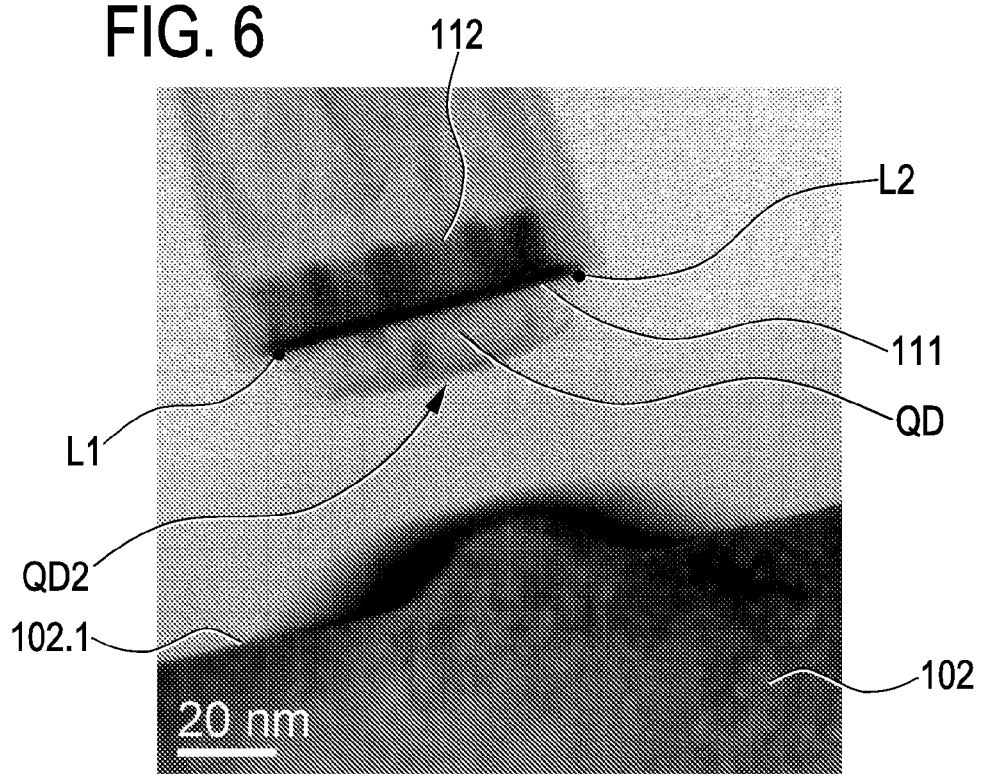
FIG. 6 is a micrograph obtained by scanning electron microscopy from a semiconductor quantum-dot device at the processing stage shown in FIG. 5.

FIG. 6 is a micrograph obtained by scanning electron microscopy from a semiconductor quantum-dot device at the processing stage shown in FIG. 5. The micrograph shows that the described processing leads to a desired structure with a quantum dot that has an extension of about 60 nm in the lateral direction and of about 20 nm in the depth direction. Reference labels used in FIG. 6 are identical to those of FIG. 5 for identical structural elements.

Figure 7:
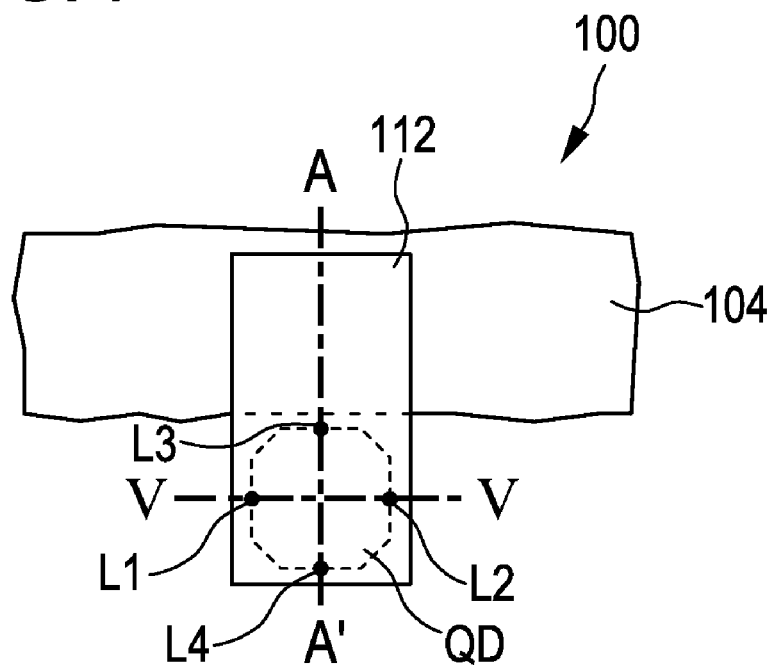
FIG. 7 is a schematic top view of the semiconductor quantum-dot device of FIGS. 1 to 5 at the processing stage shown in FIG. 5.

FIG. 7 is a schematic top view of the semiconductor quantum-dot device of FIGS. 1 to 5 at the processing stage shown in FIG. 5. The cross-sectional plane used in FIG. 5 is indicated by a dashed line V-V. The quantum dot QD has a symmetrical shape of a square with facetted corners. Consequently, a cross-sectional view in a plane indicated by a dashed line A-A in FIG. 7 would strongly resemble the cross-sections shown in FIGS. 5 and 6.

Figure 8:
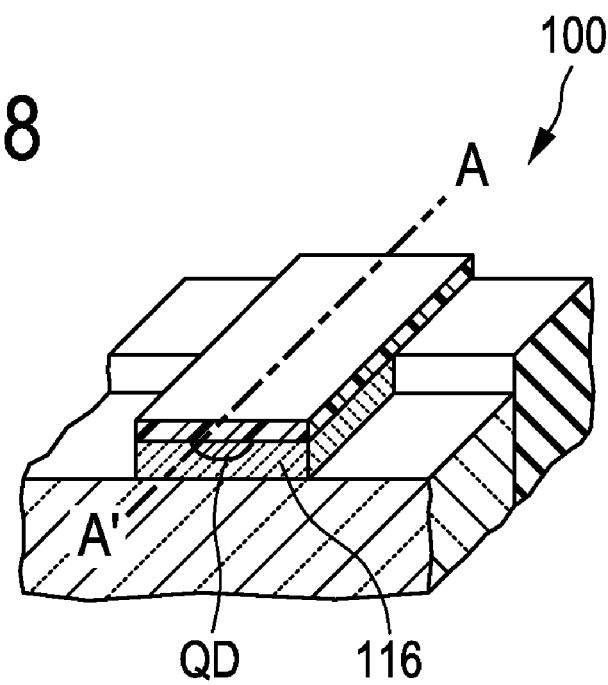
FIG. 8 is a schematic perspective sectional view of the semiconductor quantum-dot device of FIGS. 1 to 5 and 7 at a subsequent processing stage.

In a subsequent step, the quantum dot QD is embedded into a barrier 116, cf. FIG. 8. The barrier is deposited and patterned to enclose the quantum dot QD. The barrier can be made of Silicon dioxide or of a ONO layer stack. As mentioned, other materials are suitable as barrier material as well, as long as they have a band gap, which is larger than that of the active material of the quantum dot QD.

The further processing of the quantum dots depends on a desired application. In the subsequent processing, the hardmask can be removed for the fabrication for a gate stack for providing an electrical contact to the quantum dot. The dots can be positioned in anywhere in the active region, as is shown in the example of FIG. 9.

Figure 9:
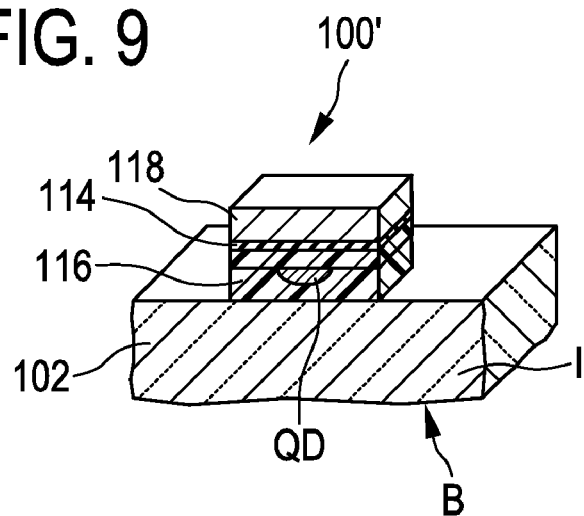
FIG. 9 is a schematic sectional view of a semiconductor quantum-dot device at a subsequent processing stage.

FIG. 9 is a schematic sectional view of a semiconductor quantum-dot device 100' at a subsequent processing stage. The same reference labels are used for functionally identical structural elements in comparison with the embodiment of FIGS. 1 to 5, 7, and 8. In the present embodiment, the dot QD is fully embedded in a barrier material 116, followed by a gate stack having a gate-isolation layer 114 and a gate layer 118.

Figure 10:
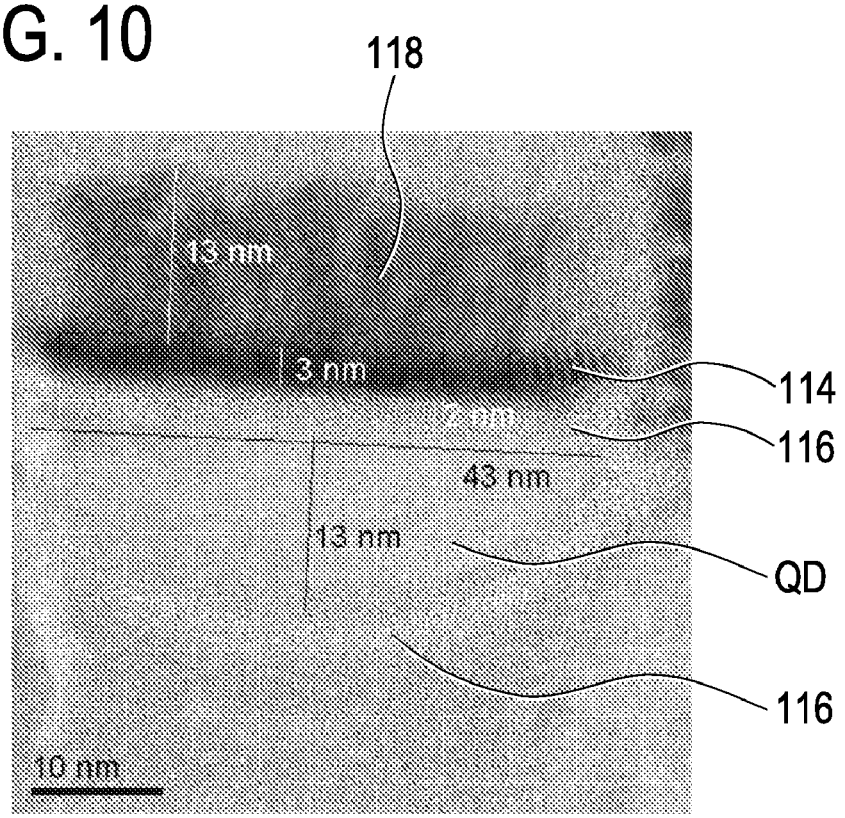
FIG. 10 is a micrograph obtained by transmission electron microscopy of a semiconductor quantum-dot device as shown in FIG. 9.

FIG. 10 shows a transmission electron micrograph of a quantum dot QD fabricated according to the described processing embodiment. The lateral dot extension is 43 nanometer, the extension of the dot towards the inner substrate is 13 nanometer at maximum. The barrier 116 is 2 nanometers thick. The gate-isolation layer has a thickness of 3 nm, and the gate layer 118 on top is 13 nm thick.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. A method for position-controlled fabrication of a semiconductor quantum dot (QD), the method comprising:
   providing a substrate of a substrate material and having a front substrate surface (102.1), an opposite back substrate surface (102.2), and an inner substrate region (I) extending from the front substrate surface to the back substrate surface;
   depositing a sacrificial layer (108) of a sacrificial material on the front substrate surface;
   depositing an active layer (110) of a semiconductive active material on the sacrificial layer, wherein the substrate, sacrificial and active materials are chosen such that the sacrificial layer is selectively removable with respect to the substrate and the active layer,
   depositing and patterning a mask layer (112) on the active layer so as to define desired quantum-dot positions in lateral directions,
   fabricating a lateral access to the sacrificial layer in regions underneath the patterned mask layer (112);
   selectively removing, with respect to the substrate and the active layer, the sacrificial layer from underneath the active layer at least under the patterned mask layer;
   etching the active layer under the patterned mask layer from underneath the active layer so as form the quantum dot with a convex second surface section, which is oriented towards the inner substrate (I).

2. The method of claim 1, further comprising:
   fabricating a barrier layer (111) on the active layer before depositing the mask layer.

3. The method of claim 1, wherein etching the active layer to assume a desired quantum-dot shape comprises applying a vapor-phase etch process to the active layer (110) under the patterned mask layer (112) after removing the sacrificial layer.

4. The method of claim 1, further comprising:
   refilling the space formerly assumed by the removed sacrificial layer regions with a semiconductive or insulating barrier (116) that has an energy band gap between a valence band and a conduction band and that has a thickness, which both are suitable for forming a barrier to the motion of the one or more charge carriers in the semiconductor quantum dot.

5. The method of claim 4, further comprising:
   removing the mask layer after the refilling, and
   fabricating a gate stack (114, 118) with an electrically conductive gate layer (118) and a gate-isolation layer (114).

6. The method of claim 1, wherein providing the substrate comprises providing a substrate with active regions being laterally defined by isolation regions (104), wherein the quantum dot is fabricated in an active region.

7. The method of claim 1, wherein the substrate material and the semiconductor active material comprise Silicon, and wherein the sacrificial material comprises Silicon-Germanium.

8. A method for fabricating a semiconductor quantum-dot device, comprising performing the method for position-controlled fabrication of a semiconductor quantum dot according to claim 1.

9. A semiconductor quantum-dot device, comprising:
a substrate (102) having a front substrate surface (102.1), an opposite back substrate surface (102.2), and an inner substrate region (I) extending from the front substrate surface to the back substrate surface;
at least one semiconductor quantum dot embedded in a barrier (111, 116) and being arranged at a smaller distance from the front substrate surface than from the back substrate surface, the barrier and the quantum dot being made of respective materials and with geometrical extensions, which materials and extensions are suitable for spatially confining the mobility of one or more charge carriers in the quantum dot to an extent that the one or more charge carriers assume quantized states with respect to all three dimensions of space;
wherein the quantum dot, as seen in a cross-sectional view revealing a first cross-sectional plane (V-V),
has first and second mutually opposite lateral end points (L1, L2), which form lateral end points of a first dot-surface section (QD1) interfacing with the barrier (111), which first dot-surface section is at least approximately parallel to the main substrate surface (M), and which also form lateral end points of a convex second dot-surface section (QD2) interfacing with the barrier (116),
wherein the second surface section of the quantum dot is oriented towards the inner substrate, and
wherein the quantum dot, as seen in a cross-sectional view revealing a second cross-sectional plane (A-A'), which is perpendicular to the first cross-sectional plane, has third and fourth mutually opposite lateral end points (L3, L4), which form lateral end points of the first dot-surface section, and which also form lateral end points of the convex second dot-surface section.

10. The semiconductor quantum-dot device of claim 9, wherein the second dot-surface section (QD2) comprises facets (QD2.1 to QD2.5), which are inclined with respect to the first surface section.

11. The semiconductor quantum-dot device of claim 9, wherein the barrier (116) comprises an ONO layer stack with a silicon nitride layer sandwiched between two silicon oxide or silicon oxynitride layers.

12. An electronic component, comprising a semiconductor quantum-dot device according to claim 9.

* * * * *